United States Patent [19]

Thompson et al.

[11] Patent Number: 5,054,418

[45] Date of Patent: Oct. 8, 1991

[54] CAGE BOAT HAVING REMOVABLE SLATS

[75] Inventors: Michael S. Thompson, North Richland Hills; Steven R. Hubbard; Franklin D. Jackson, both of Decatur, all of Tex.

[73] Assignee: Union Oil Company of California, Los Angeles, Calif.

[21] Appl. No.: 355,989

[22] Filed: May 23, 1989

[51] Int. Cl.⁵ .................... B05C 13/02; B65D 85/48
[52] U.S. Cl. .................... 118/500; 118/728; 134/25.4; 134/31; 206/454; 204/297 W; 211/41; 220/4 B; 432/253
[58] Field of Search ............... 118/500, 503, 728, 725, 118/730; 432/253, 258; 204/297 R, 297 W; 206/329, 334, 445, 449, 454–456; 217/74; 211/41; 220/4 B, 4 E; 134/25.4, 31

[56] References Cited

U.S. PATENT DOCUMENTS

| | | | |
|---|---|---|---|
| 2,544,053 | 3/1951 | Sharaf | 211/41 |
| 3,195,272 | 7/1965 | Mosher et al. | 220/4 E X |
| 3,461,842 | 8/1969 | Conrad et al. | 118/500 |
| 3,493,142 | 2/1970 | Assmann | 220/4 E |
| 3,737,282 | 6/1973 | Hearn et al. | 432/253 X |
| 3,796,182 | 3/1974 | Rosler | 118/730 X |
| 3,900,039 | 8/1975 | Dietze et al. | 134/3 |
| 3,951,587 | 4/1976 | Alliegro et al. | 432/253 |
| 4,098,923 | 7/1978 | Alberti et al. | 118/500 X |
| 4,264,803 | 4/1981 | Shinko | 432/265 X |
| 4,676,008 | 6/1987 | Armstrong | 206/454 X |
| 4,679,689 | 7/1987 | Blome | 206/334 |
| 4,694,778 | 9/1987 | Leon et al. | 118/728 |
| 4,841,906 | 6/1989 | de Geest, Jr. | 118/500 |
| 4,861,452 | 8/1989 | Stierman et al. | 204/297 W |

FOREIGN PATENT DOCUMENTS 128422  6/1931  Austria .............................. 206/445

OTHER PUBLICATIONS

"Wafer Source Boat for Capsule Diffusion"; IBM Technical Disclosure Bulletin, vol. 13, No. 6, Nov. 1970.

Primary Examiner—Bryon P. Gehman
Attorney, Agent, or Firm—Clark E. De Larvin; Gregory F. Wirzbicki; Michael A. Kondzella

[57] ABSTRACT

A cage boat having easily replaceable parts utilizes removable spacer rails for holding semiconductor wafers contained within a cage formed from slats removably attached to end pieces perpendicular to the slats.

59 Claims, 3 Drawing Sheets

CAGE BOAT HAVING REMOVABLE SLATS

FIELD OF THE INVENTION

This invention relates to the field of semiconductor processing. In one of its more particular aspects, this invention relates to a device for holding wafers of semiconducting materials during thermal processing or coating. In another of its more particular aspects, this invention relates to such a device which can be readily repaired or modified.

BACKGROUND OF THE INVENTION

In the processing of semiconductors for use in various electronic applications, it is frequently necessary to subject semiconductors to thermal processing or to coat them by such means as chemical vapor deposition. Semiconductors are typically furnished in the form of thin wafers which are treated in special furnaces or coating chambers. In order to prevent injury to the wafers, it has been found desirable to hold them in position during processing by means of slotted racks. The racks are typically placed in semi-open containers for ease in handling and to facilitate coating. One form of container which has been used is a cage boat which is a solid, two-part container provided with slots. The semiconductor wafers are placed within the cage boat, and the cage boat is then placed within the furnace or coating chamber. It is desirable to use a cylindrical configuration for the cage boat, in order to ensure uniformity in the processing of the semiconductor wafers.

In the past, racks for holding wafers of semiconducting materials and cage boats containing such racks have been fabricated of quartz. However, quartz cage boats must be handmade, requiring skilled labor and resulting in a relatively expensive device. In addition, quartz cage boats are characterized by poor dimensional tolerances. By their very nature, items fabricated from quartz are fragile. Quartz cage boats were therefore frequently broken during use. Another disadvantage of quartz cage boats is that cleaning with hydrofluoric acid, which is necessary to remove accumulations of silicon dioxide, results in the quartz being attacked by the acid and being devitrified, thereby reducing the strength of the cage boat, changing its dimensions and producing particles on the surface thereof which can contaminate the semiconductor wafers during processing.

Recently, cage boats have been produced from silicon carbide. Silicon carbide cage boats are stronger and more resistant to hydrofluoric acid than quartz, but they are expensive, difficult to fabricate and, in general, cannot be made with desired dimensional tolerances.

Because of the expense of fabricating cage boats and the need for frequent replacement thereof, it would be desirable to provide a cage boat constructed of easily fabricated material which could be readily disassembled for replacement of damaged parts.

SUMMARY OF THE INVENTION

The present invention provides a cage boat which has the advantage of being fabricated in such a manner that the parts thereof are readily replaceable. Replacement can be accomplished using common tools and does not require any special skills. The cage boat of the present invention, which is preferably in the form of a substantially closed cylinder, includes end pieces forming the bases of the cylinder and slatted walls which are releasably connected to the end pieces. The cylindrical container is divided into two halves which fit together snugly, one half containing grooved spacer rails for holding the semiconductor wafers. In general, the cage boat of the present invention comprises a pair of end pieces, a plurality of parallel slats perpendicular to said end pieces and removably attached thereto, and one or more grooved spacer rails parallel to said slats and removably positioned thereupon, said end pieces and said slats forming a cage enclosing said spacer rails.

BRIEF DESCRIPTION OF THE DRAWINGS

The invention will be more readily understood by reference to the accompanying drawings wherein like numerals refer to like elements, and in which.

DESCRIPTION OF THE PREFERRED EMBODIMENTS

The cage boat of the present invention is fabricated of materials which are sufficiently durable to be readily removable for replacement or modification. It is provided with a plurality of spacer rails which function as racks to hold the semiconductor wafers. The spacer rails are positioned upon slats forming the walls of the cylindrical container. In one embodiment, the rails are held in position by means of slots in the end pieces of the container. Replacement of a rail can be accomplished by removing one slat. In another embodiment, the rails are inserted via through-slots in one end piece and are held in position by means of fasteners which project through the end piece and press firmly against the end of the rails. In this latter embodiment, which is preferred, lateral movement of the rail is prevented. Replacement of a rail in this embodiment merely requires removing the fastener.

The cage boat of the present invention is preferably fabricated from graphite. Most preferably, all parts, including bolts and screws, are fabricated from graphite to ensure that a tight fit is maintained under processing conditions by using parts having the same coefficient of thermal expansion. Graphite has the advantages of providing the properties desired for the cage boat. In particular, graphite resists chemical attack by hydrofluoric acid, resulting in long life and consistent performance. Graphite can be fabricated to precise dimensions and is dimensionally stable. Since graphite can be purified to contain very low ash levels, i.e., less than about 5 ppm ash, the cage boat of the present invention will not contaminate wafers of semiconducting materials placed within the cage boat. In addition, graphite cage boats are light in weight, graphite having a density of about 1.8 g./cc. and have excellent thermal conductivity. Various grades of graphite are commercially available. A particularly desirable material is a fine particle, high strength, isotropic graphite available from Poco Graphite, Inc., a subsidiary of Unocal Corporation, Decatur, TX which is sold as POCO DFP-2. Other grades of graphite can be used as well. If desired, the components of the cage boat can be coated or infiltrated with pyrolytic carbon to seal the surface, reduce particulates and improve abrasion resistance.

Figure 1:
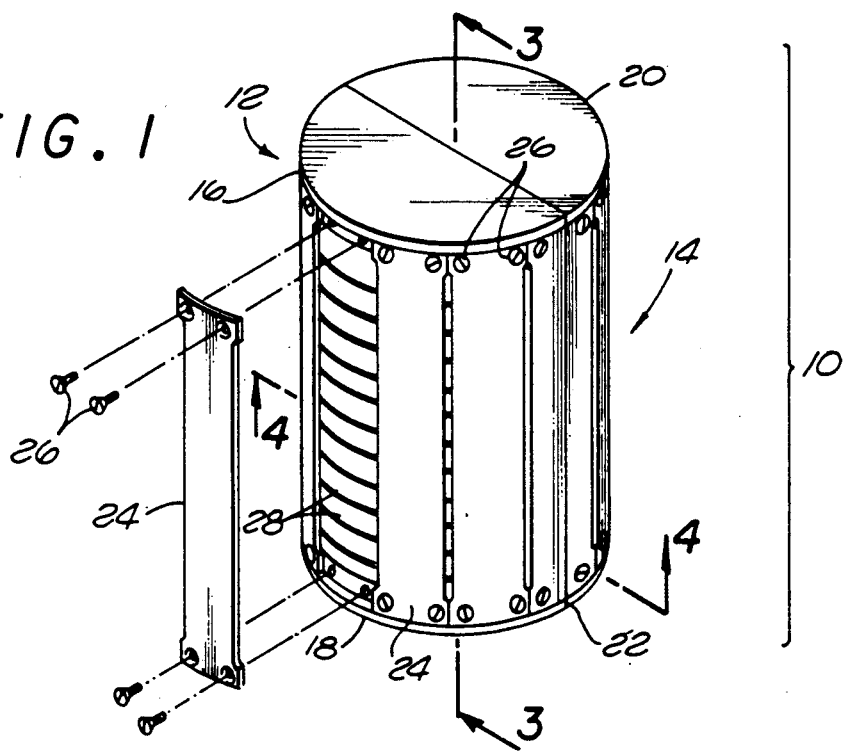
FIG. 1 is a perspective view of the cage boat of the present invention containing a plurality of semiconductor wafers and partially broken away to show the removability of a slat.

Referring to the drawings, FIG. 1 depicts the cage boat of this invention containing a plurality of semiconductor wafers in the form of circular disks. FIG. 1 shows a slat and the fasteners therefor removed from the cage boat. The numeral 10 represents the cage boat, which consists of two halves, a left half 12 and a right half 14, which fit together snugly. Left half 12 contains a top end piece 16 and a bottom end piece 18. Right half 14 contains a top end piece 20 and a bottom end piece 22. Both halves contain slats 24 which are attached to the end pieces by means of screws 26. It can be seen that slats 24 fit together to form a substantially closed cage with openings left between the slats. It is also possible to fit the slats together without leaving openings between the slats using slats having openings in the body of the slat instead.

FIG. 1 shows one of slats 24 and the screws 26 normally holding slat 24 in position against top end piece 16 and bottom end piece 18 removed from the left half 12 of cage boat 10. FIG. 1 also shows a number of semiconductor wafers 28 within cage boat 10.

Figure 2:
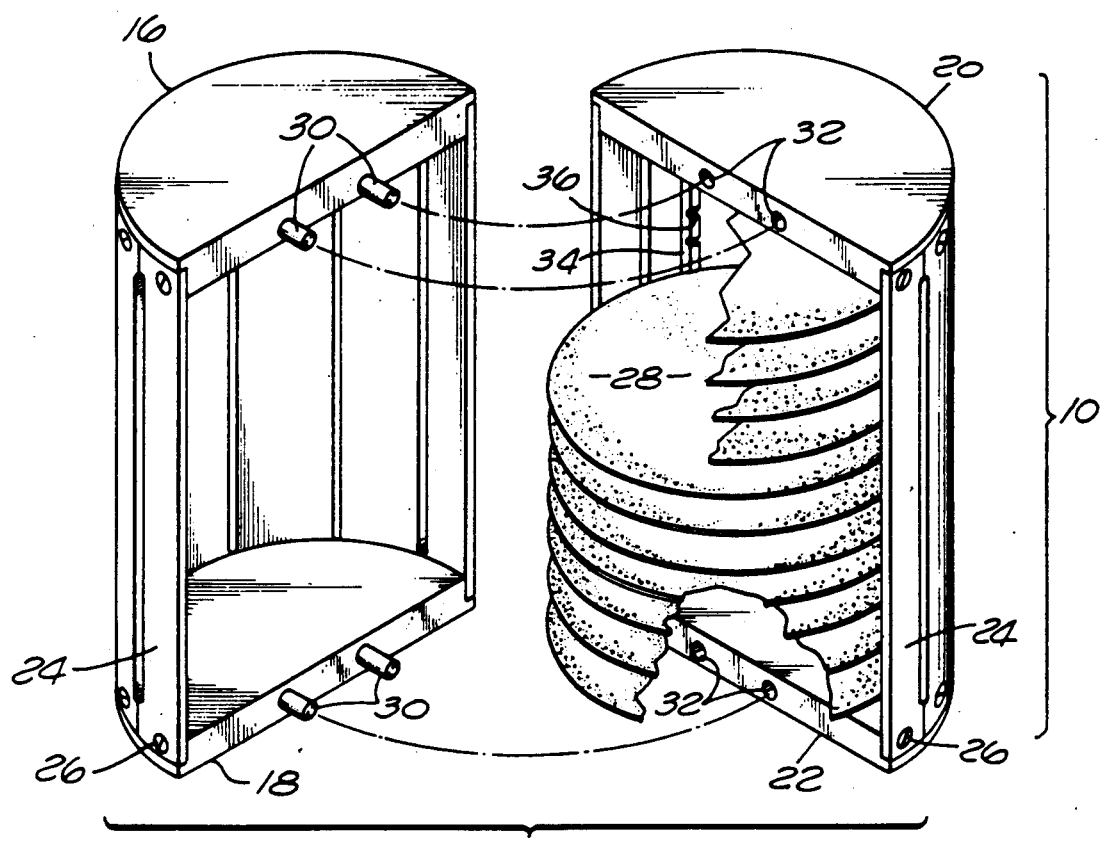
FIG. 2 is a perspective view of the cage boat of the present invention showing the two halves thereof and containing a plurality of semiconductor wafers partially broken away to show part of a spacer rail and apertures into which pegs fit for holding the two halves together.
Figure 3:
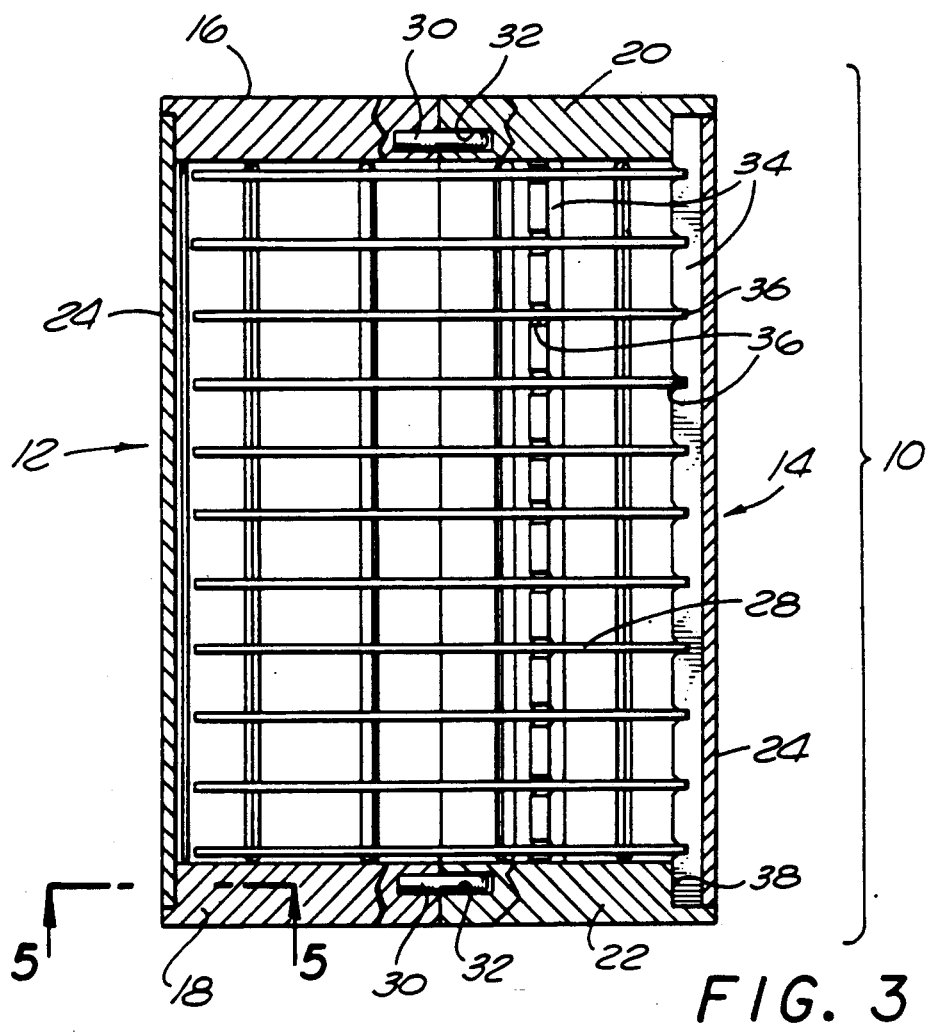
FIG. 3 is a cross-sectional view of the cage boat of the present invention taken along line 3—3 of FIG. 1.

In FIG. 2 there are additionally shown pegs 30 projecting from top end piece 16 and bottom end piece 18 of left half 12 of cage boat 10. Pegs 30 fit snugly within apertures 32 in top end piece 20 and bottom end piece 22 of right half 14 of cage boat 10 to secure the two halves together as shown in FIGS. 2 and 3. Also shown in FIGS. 2 and 3 is a spacer rail 34 containing grooves 36. The spacer rails are elongated strips which hold the semiconductor wafers within grooves therein. They rest upon the slats of the cage boat and are held in position by means of slots in the end pieces into which the ends of the spacer rails fit. In the embodiments shown in the drawings, there are three spacer rails.

Figure 4:
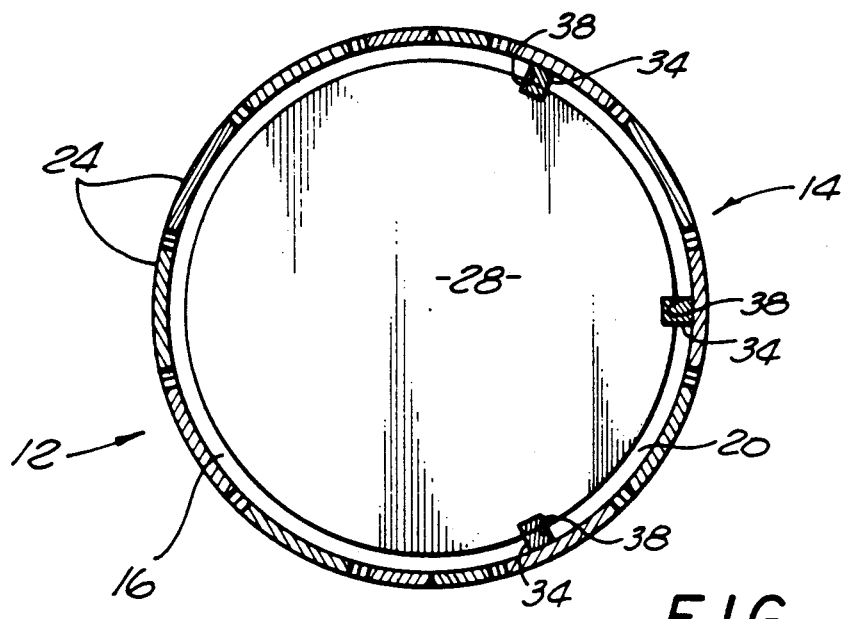
FIG. 4 is a transverse section of the cage boat of the present invention along line 4—4 of FIG. 1.

In FIG. 4 spacer rails 34 are seen fitting into slots 38 in top end piece 20 of right half 14.

Figure 5:
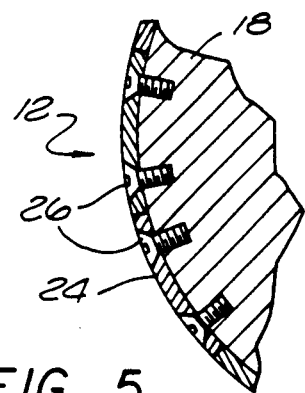
FIG. 5 is a transverse section of part of the cage boat along line 5—5 of FIG. 3.

FIG. 5 shows screws 26 securing slats 24 to bottom end piece 18 of left half 12.

Figure 6:
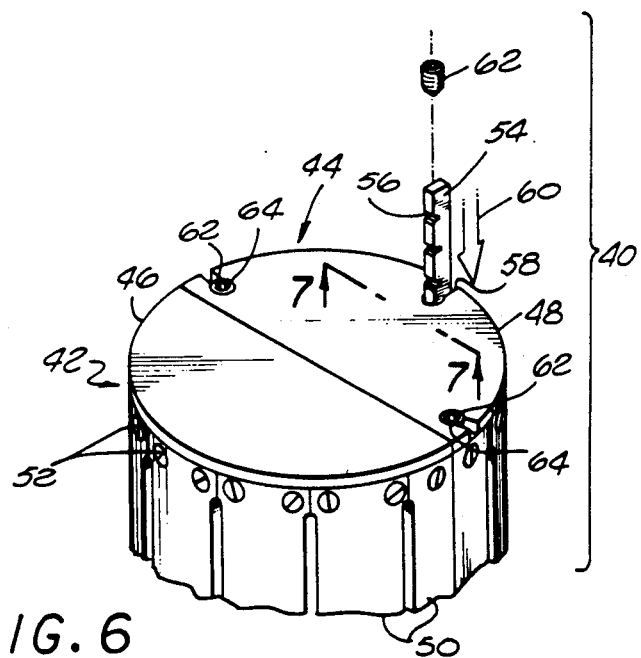
FIG. 6 is a perspective view of part of another embodiment of the cage boat of the present invention showing one of the spacer rails partially removed from the cage boat.
Figure 7:
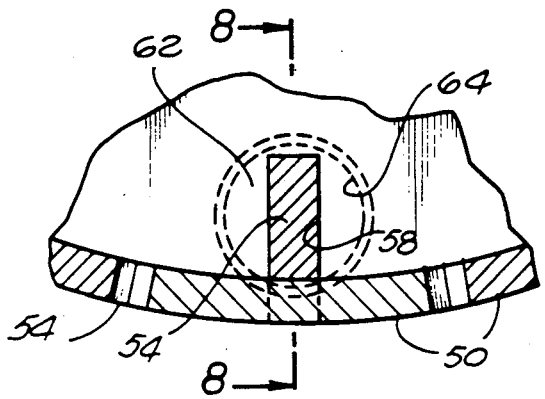
FIG. 7 is a transverse cross-section of part of the embodiment of FIG. 6 along line 7—7 of FIG. 6.
Figure 8:
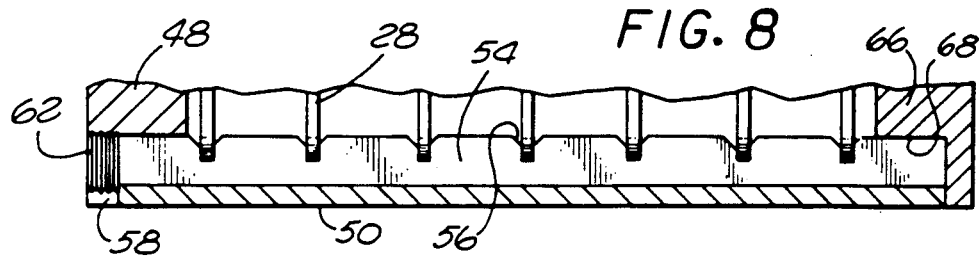
FIG. 8 is a cross-section of the embodiment shown in FIGS. 6 and 7 taken along line 8—8 of FIG. 7.

FIGS. 6, 7 and 8 illustrate a preferred embodiment of the cage boat of the present invention, which differs from the embodiment described above in having a through-slot in one end piece for insertion and removal of the spacer rails and a slot similar to that of the first embodiment in the other end piece. In this embodiment the spacer rails are fixed in position by means of set screws. Referring specifically to FIG. 6, the numeral 40 is used to designate the cage boat. As in the case of the first embodiment, cage boat 40 consists of two halves, left half 42 and right half 44. Cage boat 40 contains top end pieces 46 and 48 on left half 42 and right half 44, respectively. Slats 50 are attached to the top end pieces by means of screws 52. A spacer rail 54 having grooves 56 is shown projecting upwards from top end piece 48 of right half 44 of cage boat 40. Spacer rails 54, only one of which is shown, are inserted into cage boat 40 via through-slot 58 in top end piece 48 in the direction shown by arrow 60. Spacer rails 54 are secured against lateral movement within cage boat 40 by means of set screws 62 which are inserted into apertures 64 in top end piece 48.

FIG. 7 shows further details of the arrangement of spacer rails 54 relative to set screws 62 and other parts.

FIG. 8 additionally shows bottom end piece 66 containing slot 68 into which one end of spacer rail 54 fits. Set screw 62 presses spacer rail 54 in slot 68 against the edge of end piece 66, preventing lateral movement of rail 54.

In operation, the two halves of the cage boat are separated and semiconductor wafers are placed in the grooves of the spacer rails. The two halves are then fitted together. The resulting cage boat containing the semiconductor wafers is then in a form which can be easily picked up, by automated equipment, if desired, and deposited in a furnace or coating chamber. The cage boat is typically used in a horizontal orientation with the semiconductor wafers vertically positioned.

While either embodiment described above has the advantage of being constructed of readily removable parts which can be replaced without replacing the entire cage boat, the embodiment providing the through-slots is particularly desirable in that replacement of the spacer rails can be accomplished merely by removing the set screw fixing the spacer rail into position without requiring the removal of the slats or end pieces. Thus, for example, it is possible to remove the spacer rails for cleaning or for replacement upon their becoming worn out. They may also be removed for replacement with another spacer rail of a different size or which may contain fewer or more grooves than the spacer rail being used. In addition to the ready replaceability of the parts of the cage boat of this invention, the fabrication of the parts from graphite makes the various parts readily interchangeable, since the graphite parts can be machined to close tolerances.

While particular embodiments of the invention have been described, it will be understood, of course, that the invention is not limited thereto, since many obvious modifications can be made. For example, other shapes than the cylindrical shape of the cage boat of the present invention can be utilized while still providing the advantages of the present invention. It is intended to include any such modifications as will fall within the scope of the appended claims.

We claim:

1. A cage boat comprising a pair of planar, spaced apart end pieces, each of said end pieces extending radially outward about a common axis, a plurality of substantially parallel slats, each of said slats being perpendicular to said end pieces and removably attached thereto, and a plurality of spacer rails, parallel to said slats and removably positioned thereupon, each of said rails having a plurality of groove means for receiving semiconductor wafers, said end pieces and said slats forming a cage enclosing said spacer rails.

2. A cage boat according to claim 1 constructed of graphite.

3. A cage boat according to claim 2 wherein said graphite comprises a fine particle, high strength, isotropic graphite.

4. A cage boat according to claim 3 having a cylindrical configuration.

5. A cage boat according to claim 4 wherein said case is substantially closed, openings being provided in the body of said slats.

6. A cage boat according to claim 5 wherein each of said end pieces is divided in half.

7. A cage boat according to claim 6 wherein the end piece halves are matingly engageable to form said cage.

8. A cage boat according to claim 7 wherein said end piece halves fit together snugly.

9. A cage boat according to claim 8 wherein one of said end piece halves contains one or more projections and the other of said end piece halves contains one or more mating depressions.

10. A cage boat according to claim 9 wherein said projections comprise peg means and said depressions comprise aperture means for securing said end piece halves together.

11. A cage boat according to claim 10 wherein said slats are threadedly attached to said end pieces.

12. A cage boat according to claim 11 wherein said spacer rail is held in position by slot means in each of said pair of end pieces into which the ends of said spacer rail fit.

13. A cage boat according to claim 12 wherein one of said slot means extends through the end piece.

14. A cage boat according to claim 13 wherein said spacer rail is held stationary by means bearing against an end thereof.

15. A cage boat according to claim 14 wherein said means bearing against an end of said spacer rail extends into the slot means extending through the end piece.

16. A cage boat according to claim 15 wherein said means bearing against an end of said spacer rail comprises means threaded into the end piece through which one of said slot means extends.

17. A cage boat according to claim 16 wherein said graphite comprises a fine particle, high strength, isotropic graphite, the surface of which has been sealed with pyrolytic carbon.

18. A cage boat according to claim 4 wherein said cage is substantially closed, openings being provided between said slats.

19. A cage boat according to claim 13 wherein each of said end pieces is divided in half.

20. A cage boat according to claim 19 wherein the end piece halves are matingly engageable to form said cage.

21. A cage boat according to claim 20 wherein said end piece halves fit together snugly.

22. A cage boat according to claim 21 wherein one of said end piece halves contains one or more projections and the other of said end piece halves contains one or more mating depressions.

23. A cage boat according to claim 22 wherein said projections comprise peg means and said depressions comprise aperture means for securing said end piece halves together.

24. A cage boat according to claim 23 wherein said slats are threadedly attached to said end pieces.

25. A cage boat according to claim 24 wherein said spacer rail is held in position by slot means in each of said pair of end pieces into which the ends of said spacer rail fit.

26. A cage boat according to claim 25 wherein one of said slot means extends through the end piece.

27. A cage boat according to claim 26 wherein said spacer rail is held stationary by means bearing against an end thereof.

28. A cage boat according to claim 27 wherein said means bearing against an end of said spacer rail extends into the slot means extending through the end piece.

29. A cage boat according to claim 28 wherein said means bearing against an end of said spacer rail comprises means threaded into the end piece through which one of said slot means extends.

30. A cage boat according to claim 29 wherein said graphite comprises a fine particle, high strength isotropic graphite the surface of which has been sealed with pyrolytic carbon.

31. A cage boat according to claim 2 wherein said graphite comprises a fine particle, high strength, isotropic graphite, the surface of which has been sealed with pyrolytic carbon.

32. A cage boat according to claim 1 having a cylindrical configuration.

33. A cage boat according to claim 32 wherein said cage is substantially closed, openings being provided in the body of said slats.

34. A cage boat according to claim 33 wherein each of said end pieces is divided in half.

35. A cage boat according to claim 34 wherein the end piece halves are matingly engageable to form said cage.

36. A cage boat according to claim 35 wherein said end piece halves fit together snugly.

37. A cage boat according to claim 36 wherein one of said end piece halves contains one or more projections and the other of said end piece halves contains one or more mating depressions.

38. A cage boat according to claim 37 wherein said projections comprise peg means and said depressions comprise aperture means for securing said end piece halves together.

39. A cage boat according to claim 38 wherein said slats are threadedly attached to said end pieces.

40. A cage boat according to claim 39 wherein said spacer rail is held in position by slot means in each of said pair of end pieces into which the ends of said spacer rail fit.

41. A cage boat according to claim 40 wherein one of said slot means extends through the end piece.

42. A cage boat according to claim 41 wherein said spacer rail is held stationary by means bearing against an end thereof.

43. A cage boat according to claim 42 wherein said means bearing against an end of said spacer rail extends into the slot means extending through the end piece.

44. A cage boat according to claim 43 wherein said means bearing against an end of said spacer rail comprises means threaded into the end piece through which one of said slot means extends.

45. A cage boat according to claim 32 wherein said cage is substantially closed, openings being provided between said slats.

46. A cage boat according to claim 45 wherein each of said end pieces is divided in half.

47. A cage boat according to claim 46 wherein the end piece halves are matingly engageable to form said cage.

48. A cage boat according to claim 47 wherein said end piece halves fit together snugly.

49. A cage boat according to claim 48 wherein one of said end piece halves contains one or more projections and the other of said end piece halves contains one or more mating depressions.

50. A cage boat according to claim 49 wherein said projections comprise peg means and said depressions comprise aperture means for securing said end piece halves together.

51. A cage boat according to claim 50 wherein said slats are threadedly attached to said end pieces.

52. A cage boat according to claim 51 wherein said spacer rail is held in position by slot means in each of said pair of end pieces into which the ends of said spacer rail fit.

53. A cage boat according to claim 52 wherein one of said slot means extends through the end piece.

54. A cage boat according to claim 53 wherein said spacer rail is held stationary by means bearing against an end thereof.

55. A cage boat according to claim 54 wherein said means bearing against an end of said spacer rail extends into the slot means extending through the end piece.

56. A cage boat according to claim 55 wherein said means bearing against an end of said spacer rail comprises means threaded into the end piece through which one of said slot means extends.

57. A cage boat comprising a pair of end pieces, a plurality of substantially parallel interchangeable slats removably attached thereto and forming a slatted surface perpendicular to said end pieces, and a plurality of interchangeable grooved spacer rails, substantially parallel to said slats and removably positioned thereupon, said end pieces and said slats forming a cage enclosing said spacer rails, closed except for openings in said slatted surface, each of said end pieces being divided in half with one-half being provided with one or more projections and the other half being provided with one or more mating depressions for holding said halves together securely, each of said plurality of spacer rails being held in position at one end thereof by slot means located in one of said pair of end pieces for receiving said one end of each of said spacer rails and each of said rails being held in position at the other end thereof by means bearing against said other end and extending into a through-slot in the other of said pair of end pieces, said through-slot providing means for inserting a spacer rail into said cage without opening said cage.

58. A cage boat according to claim 57 constructed of graphite.

59. A cage boat according to claim 57 constructed of a fine particle, high strength, isotropic graphite.

* * * * *

UNITED STATES PATENT AND TRADEMARK OFFICE
CERTIFICATE OF CORRECTION

PATENT NO. : 5,054,418

DATED : Oct. 8, 1991

INVENTOR(S) : Michael Stephen Thompson, Steven R. Hubbard & Franklin D. Jackson

It is certified that error appears in the above-identified patent and that said Letters Patent is hereby corrected as shown below:

Col. 5, line 1, (Claim 19), change "13" to --18--.

Signed and Sealed this

Twenty-sixth Day of January, 1993

Attest:

STEPHEN G. KUNIN

*Attesting Officer*  *Acting Commissioner of Patents and Trademarks*